United States Patent [19]

Feldman et al.

[11] Patent Number: 4,614,433

[45] Date of Patent: Sep. 30, 1986

[54] MASK-TO-WAFER ALIGNMENT UTILIZING ZONE PLATES

[75] Inventors: Martin Feldman, Berkeley Heights; Peter A. Heimann, Clifton; William A. Johnson, Fanwood; Theodore F. Retajczyk, Jr., Clinton; Donald L. White, Bernardsville, all of N.J.

[73] Assignee: AT&T Bell Laboratories, Murray Hill, N.J.

[21] Appl. No.: 629,056

[22] Filed: Jul. 9, 1984

[51] Int. Cl.$^4$ ............................................. G01B 11/27
[52] U.S. Cl. ................................................... 356/401
[58] Field of Search ............... 356/399, 400, 401, 363; 350/162.16, 165, 642

[56] References Cited

U.S. PATENT DOCUMENTS 4,037,969  7/1977  Feldman et al. .................... 356/401
4,326,805  4/1982  Feldman et al. .................... 356/399

OTHER PUBLICATIONS

"Properties of Plasma-Deposited Films Using Ethylene and Fluoroethylenes as Starting Monomers", by T. F. Retajczyk et al., pp. 23–26, *Materials Letters*, vol. 2, No. 1, Jul. 1983.

"A Systems Approach to 1-μm NMOS", by M. P. Lepselter et al., pp. 640–656, *Proceedings of the IEEE*, vol. 71, No. 5, May 1983.

*Primary Examiner*—R. A. Rosenberger
*Attorney, Agent, or Firm*—Lucian C. Canepa

[57] ABSTRACT

Mask-to-wafer alignment in X-ray lithography is advantageously carried out utilizing zone plate marks formed on the mask and wafer. In practice, it has been observed that the intensity and in some cases even the location of the centroid of the light spot formed by a zone plate mask can vary during alignment as the mask-to-wafer spacing is changed.

The present invention is based on the discovery and analysis of the causes of such variations. Based thereon, applicants have devised a modified mask structure which, when used with a wafer in a zone plate alignment system, enables mask-to-wafer alignment to be made more easily and more reliably than was possible heretofore. The modified mask structure includes a localized blocking layer over each zone plate on the mask. This layer allows only a negligible portion of the light employed to illuminate the zone plates on the mask to propagate into the mask-to-wafer space. Also, the modified mask structure includes an antireflection layer that reduces interference effects between light spots imaged by the wafer zone plates and light reflected from the mask. Further, one layer of the modified mask structure is designed to have a quarter-wavelength thickness thereby minimizing interfering light reflected from that layer.

14 Claims, 5 Drawing Figures

MASK-TO-WAFER ALIGNMENT UTILIZING ZONE PLATES

BACKGROUND OF THE INVENTION

This invention relates to the fabrication of integrated-circuit devices and, more particularly, to techniques for achieving improved mask-to-wafer alignment during manufacture of such devices.

X-ray lithography is being actively explored as a promising approach for achieving fine-line patterning of devices. An attractive way of realizing high-precision mask-to-wafer alignment in an X-ray patterning system involves the use of zone plates on the mask and wafer, as described, for example, in U.S. Pat. No. 4,037,969 issued to M. Feldman and A. D. White.

Illustratively, mask and wafer zone plates utilized for alignment purposes are illuminated by a collimated laser beam. Advantageously, the angle of illumination is chosen to be off-normal relative to the surfaces of the mask and wafer, as described in U.S. Pat. No. 4,326,805 issued to M. Feldman, A. D. White and D. L. White. As a result of this off-normal inclination, uniform magnification errors (such as those resulting from variations in the temperature of the wafer) can be detected, and the errors can be corrected by changing the mask-to-wafer separation.

In practice, however, it has been observed that the intensity and in some cases even the location of the centroid of the light spot formed by a laser-beam-illuminated zone plate changes as the mask-to-wafer spacing is varied. Such intensity changes typically complicate the alignment process. And, of course, any changes in the location of the centroid of the imaged light spot inevitably cause actual alignment errors to occur.

Accordingly, efforts have been directed by workers in the art at trying to understand the basis for the aforespecified deleterious phenomena. It was recognized that these efforts, if successful, might lead to improved alignment techniques in which the specified phenomena are eliminated or at least minimized. In turn, the availability of such improved alignment techniques could provide a basis for making higher-quality fine-line devices in a more reliable and less expensive way.

SUMMARY OF THE INVENTION

Hence, an object of the present invention is to provide improved alignment techniques. More specifically, an object of this invention is to achieve improved mask-to-wafer alignment utilizing zone plates.

Briefly, these and other objects of the present invention have been realized by applicants based on their discovery and analysis of certain interference effects that occur in a mask/wafer assembly that includes zone plates. Based thereon, applicants devised an improved mask structure which, when used with a wafer in a zone plate alignment system, enables mask-to-wafer alignment to be made in an easier and more reliable manner than was possible heretofore.

In accordance with applicants' invention, only a negligible portion of the light employed to illuminate the zone plates on the mask is allowed to propagate into the mask-to-wafer space and to be reflected back from the wafer to impinge upon the mask zone plates. This is accomplished by forming a localized blocking layer over each zone plate on the mask. The layer effectively blocks the formation by the mask zone plates of interfering image spots above the surface of the mask arising from wafer-reflected light. If not prevented or at least substantially reduced, such interference effects can cause objectionable intensity or positional variations in image spots focused by mask zone plates.

In accordance with another feature of applicants' invention, the surface of a boron nitride layer of a boron nitride/polyimide mask structure is coated with a layer that is antireflective at the wavelength of the light utilized to illuminate zone plates on a wafer that is spaced apart from the mask structure. This reduces interference effects between light spots imaged by the wafer zone plates and light reflected from the mask. This also improves the stability of the light spot-to-background noise ratio by reducing background variations due to light reflected from the mask. If not eliminated or substantially reduced, such effects can, during the alignment process, cause troublesome intensity variations in the images formed by the wafer zone plates.

In accordance with still another feature of applicants' invention, the polyimide layer in the aforespecified mask structure is designed to have a so-called quarter-wave thickness. Consequently, reflections from the top and bottom surfaces of this layer destructively interfere with each other. As a result, the net amount of interfering light reflected from the polyimide layer of the mask is minimized. If not minimized, this reflected light also can, during the alignment process, cause troublesome intensity variations in the images formed by the wafer zone plates.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

As described, for example, in "A System Approach to 1-$\mu$m NMOS," *Proceedings of the IEEE*, Volume 71, No. 5, May 1983, pages 640–656, the X-ray wavelength utilized in one known X-ray lithography system is the 4.36-Angstrom-unit (Å) palladium line. A specific illustrative mask structure for use in such a system is described in the cited article and is depicted in FIG. 1.

Figure 1:
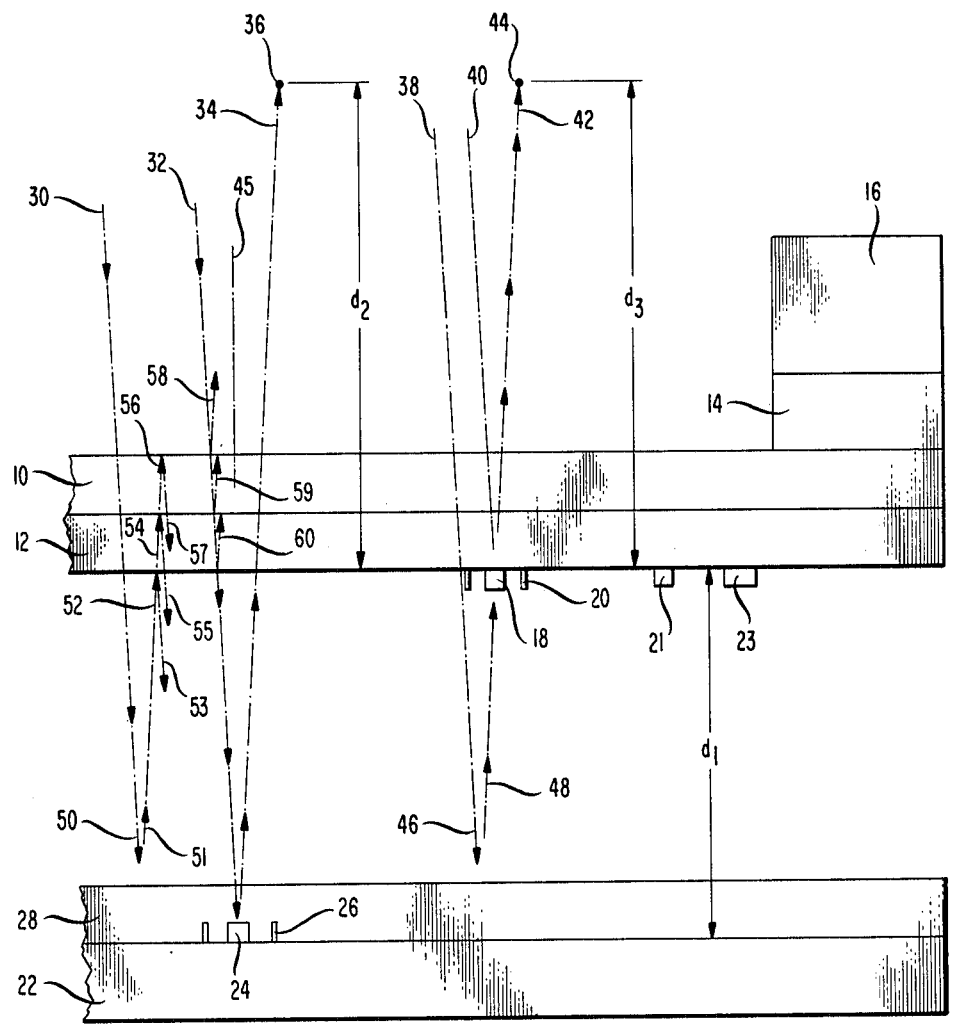
FIG. 1 is a cross-sectional representation of a portion of a known mask/wafer assembly that includes zone plates.

By way of a particular example, the known mask structure shown in FIG. 1 comprises a 4-micron ($\mu$m)-thick membrane 10 of so-called boron nitride (actually boron, nitrogen and hydrogen in the atomic percent ratio of about 20:5:75) coated with a 2-$\mu$m-thick layer 12 of a polyimide material.

The membrane 10 and the layer 12 are supported by an annular ring 14 of silicon. In turn, the ring 14 is epoxy-bonded to a rigid annular ring 16 made of pyrex glass. An X-ray absorber (300 Å of tantalum overcoated with 6000 Å of gold and 800 Å of tantalum) is deposited on the layer 12 and then patterned using an electron-beam exposure system to delineate the features for one level of an integrated-circuit device. Zone plate alignment marks are also so defined in the three-layer absorber.

The membrane 10 and the layer 12 are essentially transparent to 4.36 Å X-rays. Additionally, they are transparent to light utilized to illuminate the zone plate marks on the mask/wafer assembly during alignment.

FIG. 1 schematically depicts a portion of a single zone plate alignment mark defined on the mask structure. The depicted portion comprises a circular region 18 and an annular region 20. (Although these regions are in fact each advantageously made of the three-layer metallization specified above, the regions are for the sake of simplicity, schematically represented in FIG. 1 as each comprising only a single layer.) An actual zone plate alignment mark comprises a series of spaced-apart concentric rings encompassing the regions 18 and 20. In practice, several such marks are typically included on the depicted mask structure.

X-ray-absorptive portions definitive of a feature included in one level of an integrated-circuit device are also schematically represented in FIG. 1. These portions of the mask structure are designated in FIG. 1 by reference numerals 21 and 23.

A portion of a standard wafer 22 is also shown in FIG. 1. Illustratively, the distance $d_1$ between the top surface of the wafer 22 and the bottom surface of the layer 12 of the mask structure is nominally 40 μm. In practice, several zone plate alignment marks are typically formed on the wafer 22. A portion of only one such mark, comprising a circular region 24 and an annular region 26, is schematically represented in FIG. 1. Overlying the wafer is a 0.7-μm-thick layer 28 of a conventional X-ray-sensitive resist. Alternatively, a standard trilevel structure (for example, 1.8 μm of hard-baked HPR resist, 1200 Å of silicon dioxide and 0.7 μm of an X-ray-sensitive resist) may overlie the wafer 22.

As indicated in FIG. 1 by arrows 30 and 32, the wafer zone plate mark comprising the regions 24 and 26 is assumed to be illuminated by a collimated beam emanating from a light source (not shown). Illustratively, the source comprises a helium-neon laser emitting light at a wavelength of 6328 Å. In response to such illumination, the wafer zone plate forms a focused image of the source at a specified distance $d_2+d_1$ above the bottom surface of the layer 28, as represented in FIG. 1 by arrow 34 and spot 36.

Similarly, as indicated in FIG. 1 by arrows 38 and 40, a collimated laser beam also emanating, for example, from a laser operating at 6328 Å illuminates the mask zone plate mark comprising the regions 18 and 20. In response thereto, the mask zone plate forms a focused image of the source at a specified distance $d_3$ above the bottom surface of the layer 12, as represented in FIG. 1 by arrow 42 and spot 44.

As is well known, the distances $d_2$ and $d_3$ shown in FIG. 1 can be made equal by designing the depicted zone plates such that the focal length of the wafer zone plate is greater than the focal length of the mask zone plate by the distance $d_1$. In that case, images formed by a set comprising zone plates on the mask and underlying associated zone plates on the wafer will appear, when the mask and wafer are aligned, as a cluster of image spots forming a specified pattern in a common plane parallel to the top surface of the membrane 10. In other words, the associated set of image spots produced will be in focus at the same elevation. Alignment can be done automatically by an image-processing system that determines the relative positions of the focused spots, in a standard manner known in the art.

Advantageously, for the reason specified earlier above, the collimated beams represented by the arrows 30, 32 and 38, 40 are each directed at the top surface of the membrane 10 at a small angle with respect to reference line 45 which is perpendicular to the top surface of the membrane 10. Illustratively, the beams are each disposed at an angle of about 3 degrees with respect to the line 45.

As specified earlier above, it may be necessary during the alignment process to vary the mask-to-wafer distance $d_1$ (FIG. 1). In practice, however, it has been observed that doing so results in variations in the intensities of the image spots formed by the herein-described zone plate marks. For some spacings, this actually leads to a spot-to-noise ratio that is so low that proper alignment cannot be readily achieved or achieved at all. In other cases, it has been observed that the centroids of the focused image spots actually move as the mask-to-wafer spacing is varied. Of course, this last-mentioned phenomenon results in alignment errors.

Through careful investigation of mask/wafer assemblies that include zone plate alignment marks, applicants discovered and analyzed certain interference effects that give rise to the aforementioned phenomena. These effects can be understood by reference to FIG. 1.

Various undesired light reflections occur in the mask/wafer assembly depicted in FIG. 1. By way of example, some of these reflections are explicitly represented in FIG. 1. Thus, a portion of the illuminating beam that is directed at the mask zone plate comprising the regions 18 and 20 impinges upon and is reflected from the surface of the resist-coated wafer 22, as indicated in FIG. 1 by arrows 46 and 48. This wafer-reflected light, still in the form of a parallel beam, is then diffracted in transmission by the mask zone plate. The focused spot that is thereby formed is coherent with the spot formed by light initially imaged in reflection by the mask zone plate. But the relative phase between these spots is determined by the additional path length (approximately $2d_1$) taken by the wafer-reflected light. Consequently, as $d_1$ is varied, the intensity of the image formed at the spot 44 also varies. In some cases, the intensity of the spot 44 changes by as much as 90 percent for a change in $d_1$ of as little as 0.15 μm. In cases where the intensities of the spots interfere destructively, the net intensity of the spot 44 may become so low as to make accurate and/or rapid alignment difficult or virtually impossible.

Furthermore, in some cases the focusing characteristics of the mask zone plate shown in FIG. 1 are different in reflection than they are in transmission. In such cases, or if the wafer 22 and resist 28 are not perfectly flat, the centroids of the respective spots imaged in reflection and transmission may not coincide exactly and, as a consequence, the net resulting image spot may appear to a detector and image-processing system to be positioned at a location different from that formed by a zone plate in reflection only.

Some of the other troublesome reflections that occur in the herein-described mask/wafer assembly are also represented schematically in FIG. 1. Thus, for example, a portion of the illuminating beam directed at the wafer zone plate comprising the regions 24 and 26 is reflected one or more times from the top surface of the resist layer 28 and the wafer 22 and from the layer 12 and the membrane 10 before impinging upon the wafer zone plate, as represented by arrows 50 through 57 in FIG. 1. This reflected portion of the beam combines with the incident portion that propagates directly from the illumination source to the wafer zone plate. Whether the net result of the combination is constructive or destructive, and the extent thereof, is a function of the mask-to-wafer separation $d_1$. This effect makes it appear that the intensity of the illumination incident on the wafer zone is variable. Of course, the intensity of the spot 36 will also consequently vary.

Additionally, portions of the incident beam utilized to illuminate the wafer zone plate shown in FIG. 1 are reflected from various interfaces of the depicted mask structure, as indicated by arrows 58 through 60. In turn, these portions can interfere with light reflected from the surface of the wafer (see, for example, the arrows 51 and 52) to cause changes in the intensity of the background light against which the zone plate images are to be detected. Moreover, such reflections from the mask interfaces can interfere with light imaged by the wafer zone plate. This causes the intensity of the focused spot 36 to change as the mask-to-wafer separation $d_1$ is varied.

Figure 2:
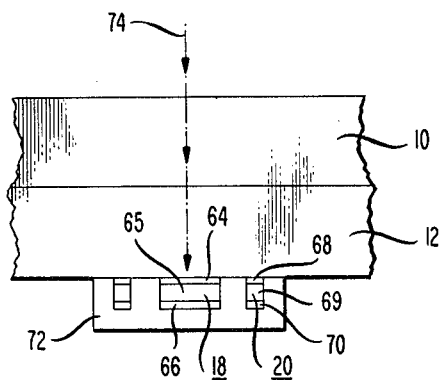
FIGS. 2 and 3 each depict in cross section a portion of a specific illustrative mask that embodies one feature of the principles of the present invention.
Figure 3:
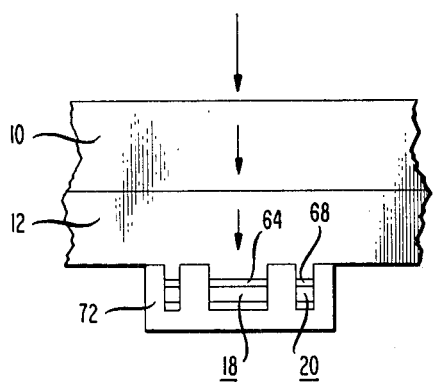
Figure 5:
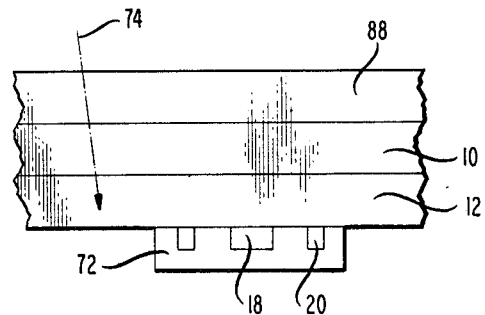
FIG. 5 is a cross-sectional showing of a portion of a specific illustrative mask that embodies the FIG. 2 feature and two additional features of the present invention.

In accordance with the principles of applicants'0 invention, various modifications are made to a mask structure to eliminate or substantially reduce the aforedescribed troublesome effects in a mask-to-wafer alignment system. One such modification is schematically represented in FIGS. 2 and 3. Additional advantageous modifications are depicted in FIG. 5.

The regions 18 and 20 of the mask zone plate shown in simplified form in FIG. 1 are depicted in more detail in FIG. 2. As indicated in FIG. 2, each of these regions actually comprises three layers. Thus, for example, the region 18 comprises three layers 64 through 66 made of tantalum, gold and tantalum, respectively. The annular region 20 also comprises three layers 68 through 70 made of tantalum, gold and tantalum, respectively. By way of illustration, the membrane 10 and the layer 12 shown in FIG. 2 are identical to the correspondingly numbered elements described above and shown in FIG. 1.

In accordance with the principles of applicants' invention, a so-called blocking layer 72 (FIG. 2) is formed on the bottom surface of the layer 12 to cover each mask zone plate and the surface immediately therearound. The purpose of the layer 72 is to block laser illumination (represented by arrow 74) which is directed at the zone plate from propagating into the mask-to-wafer space and subsequently being reflected from the wafer back towards the zone plate. Moreover, the layer is effective to block whatever light does penetrate into the mask-to-wafer space and is reflected from the wafer from actually reaching the mask zone plate. The harmful effects of such reflections were described earlier above. By means of the blocking layer 72, these effects are eliminated or at least significantly reduced. In turn, alignment utilizing zone plates is thereby greatly facilitated.

The particular nature of the material selected to form the blocking layer 72 depends on the characteristics of the tantalum layers 64 and 68. In some cases, the tantalum layers as deposited and patterned exhibit a light-reflective property with respect to the incident laser illumination. In other cases, these layers exhibit a light-absorptive property. For reflective tantalum layers, the material of the blocking layer 72 is advantageously selected to be absorptive of the incident laser light. For absorptive tantalum layers, the material of the blocking layer 72 is advantageously selected to be reflective of the incident laser light. By such selection, the desired blocking action is achieved without interfering to any appreciable extent with the imaging characteristics of the zone plates. In some cases, the diffraction efficiency of the zone plates may actually thereby be improved.

Various reflective materials suitable for forming the blocking layer 72 (FIG. 2) are known. One advantageous such material comprises aluminum. Thus, the layer 72 may be formed, for example, by depositing a 0.25-$\mu$m-thick film of aluminum over the entire bottom surface of the mask layer 12. The aluminum film is then patterned, for example by standard lithographic techniques, to remove selected portions of the aluminum film. The resulting pattern of aluminum that remains on the bottom surface of the mask layer 12 includes the blocking layer 72. A more complete representation of this pattern will be described later below in connection with FIG. 4.

Figure 4:
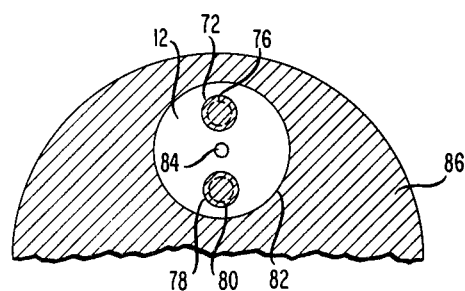
FIG. 4 is a plan view of a portion of a mask that embodies the inventive feature represented in FIG. 2 or FIG. 3.

Various absorptive materials suitable for forming the blocking layer 72 (FIG. 2) are known. One advantageous such material comprises Microdeposit 1300-25 photoresist (available from Shipley Company, Newton, Mass.) having a dye such as Morton Automate Blue 8 (available from Pylan Packer Company, Garden City, N.Y.) combined therewith at 5 volume percent. The dye is strongly absorptive of the 6328-Å laser light utilized to illuminate the mask zone plates. Illustratively, a 1.5-$\mu$m-thick film of photoresist/dye formed on the bottom surface of the mask layer 12 and the patterned employing standard lithographic techniques serves as an effective absorber. The resulting absorptive pattern that remains on the bottom surface of the mask layer 12 includes the blocking layer 72. A more complete representation of this pattern is shown in FIG. 4 and will be described later below.

In further accord with applicants' inventive principles, it is feasible to utilize a reflective material such as aluminum to form the blocking layer 72 even if the tantalum layers 64 and 68 exhibit a light-reflective property. But in that case, the mask layer 12 must be suitably modified at least in the immediate vicinity of each zone plate. Otherwise the zone plates would in effect be turned into mirrors and not perform their desired image-forming function.

FIG. 3 illustrates the required modification of the mask layer 12. As indicated, bottom surface portions of the layer 12 not protected by the regions 18 and 20 of the mask zone plate are etched (or otherwise removed) by a specified amount. As a result, incident light "sees" relatively thicker portions of the layer 12 directly underlying the zone plate regions than it does to the removed portions.

Illustratively, the bottom surface portions of the layer 12 not protected by the regions 18 and 20 of the mask zone plate represented in FIG. 3 are thinned to establish approximately a quarter-wavelength phase difference relative to the unthinned portions for light propagating therethrough. The layer 12 typically has an index of refraction of about 1.5. Thus, for 6328 Å light, the layer 12 should be thinned by approximately 1050 Å (or a multiple thereof, as will be specified later below).

As a result, the zone plate shown in FIG. 3 functions effectively as a phase-type zone plate even if the layers 64, 68 and 72 are about equally reflective. And to the extent that the respective reflectivities of these layers differ substantially, the depicted zone plate also exhibits the characteristics of an amplitude-type zone plate. In either case, a zone plate having high-diffraction-efficiency properties is provided.

A more complete representation of the reflective and absorptive patterns mentioned above is shown in FIG. 4 which is a plan view of the bottom of the mask layer 12. The aforespecified localized blocking layer 72 comprises one element of the depicted pattern. The outer boundary of the outermost annular region of the mask zone plate that is covered by the layer 72 is schematically represented in FIG. 4 by dashed line 76.

Another reflective or absorptive localized blocking layer 78 is shown in FIG. 4. Underlying the layer 78 is another mask zone plate, which is schematically represented by dashed line 80. Surrounding the blocking layers 72 and 78 is an area from which the absorptive or reflective material has been completely removed. This area, bounded by line 82, reveals a portion of the surface of the transparent layer 12. Laser light can thus propagate through the layer 12 to illuminate an underlying wafer zone plate that, for alignment purposes, constitutes a set with the mask zone plates 76 and 80. Such a wafer zone plate is schematically indicated in FIG. 4 by circle 84.

The remainder of the surface of the layer 12 represented in FIG. 4 is covered with the aforespecified reflective or absorptive material, as indicated by reference numeral 86. In practice, other windows or areas such as the area bounded by the line 82 are typically formed in the material overlying the layer 12 in portions of the mask that are not shown in FIG. 4. Each such window contains other mask zone plate alignment marks each covered with a localized blocking layer such as the layers 72 and 78.

The mask structure shown in FIG. 5 includes a zone plate comprising the regions 18 and 20 covered with a blocking layer 72 of the type specified above. Incident light is directed at one or more underlying wafer zone plates (such as the wafer zone plate comprising the regions 24 and 26 shown in FIG. 1), as indicated in FIG. 5 by arrow 74. For the purpose of minimizing the aforedescribed interference effects between light focused by the wafer zone plates and light reflected from the mask, additional modifications to a standard mask are made. These modifications comprise adding an antireflective coating 88 to the top surface of the membrane 10 and forming the layer 12 to exhibit a so-called quarter-wave thickness.

For incident light having a wavelength W in air, the wavelength in a material having an index of refraction n is W/n. For the material to have a so-called quarter-wave thickness, its thickness is selected to be $W/4n \times N$, where N is an odd integer. The term "quarter-wave thickness" as employed herein will be understood to be so defined. Advantageously, the coating 88 of FIG. 5 is selected to have a refractive index that is the square root of the refractive index of the membrane 10 divided by the square root of the refractive index of air. Also, the thickness of the coating 88 is designed to be equal to a quarter-wavelength of the illuminating laser light in the coating. As a result, reflections from the top surface (air-to-coating 88 interface) and the bottom surface (coating 88-to-membrane 10 interface) of the coating 88 are approximately equal in intensity and interfere destructively. Hence, reflections from the top surface of the membrane 10 are thereby eliminated or at least substantially reduced.

Illustratively, the membrane 10 (FIG. 5) made of boron nitride has a refractive index in the range of 1.8-to-2.3. For such a membrane, various suitable antireflective coatings are available. One such material comprises a plasma-deposited fluorocarbon of the type described, for example in "Properties of Plasma-Deposited Films Using Ethylene and Fluoroethylenes as Starting Monomers," by T. F. Retajczyk and P. K. Gallagher, *Materials Letters*, Volume 2, No. 1, July 1983, pages 23–26. The materials described therein exhibit refractive indices of about 1.40. Other suitable materials for the coating 88 include sputtered silicon dioxide having an index of refraction of about 1.47 and a spun-on siloxane polymer (such as Owens-Illinois glass resin type 950) having an index of refraction of approximately 1.52. For incident light having a wavelength of 6328 Å, the quarter-wavelength thicknesses for materials having refractive indices of 1.40, 1.47 and 1.52 are approximately 1130 Å, 1076 Å and 1040 Å, respectively, or odd multiples thereof, as specified earlier above.

Additionally, as indicated above, the layer 12 of FIG. 5 is advantageously selected in accordance with this invention to have a quarter-wave thickness. As a result, reflections from the top surface (membrane 10-to-layer 12 interface) and the bottom surface (layer 12-to-air interface) of the layer 12 interfere destructively. Hence, reflections from the top and bottom of the layer 12 are thereby substantially reduced.

Thus, FIG. 5 represents an advantageous mask structure in which the various deleterious interference effects described earlier herein are eliminated or substantially reduced. Such a structure facilitates and improves mask-to-wafer alignment utilizing zone plate marks.

Finally, it is to be understood that the above-described techniques are only illustrative of the principles of the present invention. In accordance with these principles, numerous modifications and alternatives may be devised by those skilled in the art without departing from the spirit and scope of the invention. For example, although primary emphasis herein has been directed to mask-to-wafer alignment utilizing zone plate marks, it is to be understood that applicants' inventive principles are useful wherever interference effects occur during utilization of monochromatic radiation to illuminate alignment marks or other features on a multiple layered structure such as the specific herein-considered mask/air gap/wafer structure. Moreover, when feasible, the thickness of the boron nitride membrane 10 also should be controlled to minimize deleterious reflections. Additionally, a quarter-wave thickness of material may be added under the reflective blocking layer 72 to produce a high diffraction efficiency phase-type zone plate.

What is claimed is:

1. A process for aligning a mask element with respect to a wafer element during manufacture of integrated-circuit devices on the wafer, wherein each of said mask and wafer elements includes at least one alignment mark, said mask element comprising an antireflection coating on the side thereof opposite to the side that includes said at least one mark and comprising a localized blocking layer encompassing each such mark, said process comprising the step of directing incident coherent radiation at said marks off-normal with respect to the surface of said coating such that reflections from said mask are minimized, and reducing by means of the localized blocking layer that encompasses each such mark the amount of said incident radiation that propagates into the mask-to-wafer space to be reflected from the surface of the wafer element towards said at least one mark on said mask element.

2. In combination in a device fabrication system in which spaced-apart mask and wafer elements are to be aligned with respect to each other by directing incident radiation thereat, said mask element comprising
   a layer that is transparent to said incident radiation directed at said mask element for alignment purposes,
   at least one zone plate alignment mark on one side of said layer,
   and a localized blocking layer encompassing each mask zone plate mark to block said incident radiation from propagating into the mask-to-wafer space and being reflected back from the wafer element to the mark.

3. A combination as in claim 2 wherein the wafer element includes at least one zone plate alignment mark and the mask element further comprises
   a transparent membrane in contact with the other side of said transparent layer,
   and a coating on said membrane constituting an antireflection coating for said incident radiation.

4. A combination as in claim 3 wherein the thickness of the transparent layer is approximately a quarter-wave thickness for said incident radiation.

5. A combination as in claim 4 in which said transparent layer comprises a polyimide material and said membrane comprises boron nitride.

6. A combination as in claim 5 wherein said blocking layer comprises a material that is reflective of said incident radiation.

7. A combination as in claim 6 wherein said blocking layer comprises aluminum.

8. A combination as in claim 7 wherein the portions of said transparent layer directly underlying elements of each mask zone plate differ in thickness by approximately a quarter-wavelength of the wavelength of said incident radiation from portions of said transparent layer that lie between said elements.

9. A combination as in claim 5 wherein said blocking layer comprises a material that is absorptive of said incident radiation.

10. A combination as in claim 9 wherein said blocking layer comprises a photoresist having therein a dye that is absorptive of said incident radiation.

11. In combination in a device fabrication system in which spaced-apart mask and wafer elements are to be aligned with respect to each other by directing incident radiation thereat, each of said elements including at least one zone plate alignment mark, said mask element comprising
   first and second layers that are transparent to said incident radiation directed at said mask element for alignment purposes, said layers having facing surfaces in intimate contact with each other, said at least one zone plate alignment mark being on the other surface of said first layer,
   and an antireflection coating for said incident radiation on the other surface of said second layer,
   wherein said first layer has approximately a quarter-wavelength thickness with respect to said incident radiation,
   and wherein each zone plate alignment mark on the mask element is covered with a layer that blocks said incident radiation from propagating into the mask-to-wafer space and being reflected from the wafer element back to said mask mark.

12. A combination as in claim 11 wherein said first layer comprises a polyimide material and said second layer comprises boron nitride.

13. A combination as in claim 12 wherein said antireflection coating comprises a material selected from the group consisting of plasma-deposited fluorocarbon, sputtered silicon dioxide and spun-on siloxane polymer.

14. A combination as in claim 13 wherein said system comprises an X-ray lithography system designed for operation at the 4.36 Å palladium line and each of said zone plate alignment marks includes three-layer elements comprising tantalum, gold and tantalum, in that order, on the other surface of said first layer.

* * * * *